(12) United States Patent
Vanalli et al.

(10) Patent No.: US 8,928,123 B2
(45) Date of Patent: Jan. 6, 2015

(54) THROUGH VIA STRUCTURE INCLUDING A CONDUCTIVE PORTION AND ALIGNED SOLDER PORTION

(71) Applicants: STMicroelectronics S.r.l., Agrate Brianza (IT); Politecnico di Milano, Milan (IT)

(72) Inventors: Gian Pietro Vanalli, Almenno San Bartolomeo (IT); Giovanni Campardo, Bergamo (IT); Aldo Losavio, Bergamo (IT); Paolo Pulici, Legnano (IT); Pier Paolo Stoppino, Milan (IT)

(73) Assignees: STMicroelectronics S.r.l., Agrate Brianza (MB) (IT); Politecnico di Milano, Milan (IT)

( * ) Notice: Subject to any disclaimer, the term of this patent is extended or adjusted under 35 U.S.C. 154(b) by 0 days.

(21) Appl. No.: 14/291,749

(22) Filed: May 30, 2014

(65) Prior Publication Data

US 2014/0264852 A1    Sep. 18, 2014

Related U.S. Application Data

(62) Division of application No. 12/537,075, filed on Aug. 6, 2009, now Pat. No. 8,759,215.

(30) Foreign Application Priority Data

Aug. 8, 2008    (IT) .............................. MI2008A1505

(51) Int. Cl.
  *H01L 29/40*    (2006.01)
  *H01L 23/00*    (2006.01)
  *H01L 23/498*   (2006.01)

(52) U.S. Cl.
  CPC .......... *H01L 24/06* (2013.01); *H01L 23/49811* (2013.01); *H01L 23/49827* (2013.01)

USPC ................... 257/621; 257/737; 257/E23.021; 257/E23.022; 438/667

(58) Field of Classification Search
  CPC ................... H01L 21/30655; H01L 21/76898; H01L 23/481; H01L 24/03; H01L 24/11; H01L 25/0657; H01L 25/18; H01L 24/06; H01L 23/49811; H01L 23/49827
  USPC ........... 438/667; 257/621, E23.021, E23.022, 257/737, E21.022

See application file for complete search history.

(56) References Cited

U.S. PATENT DOCUMENTS 5,618,752 A    4/1997    Gaul
6,033,990 A    3/2000    Kishimoto et al.
(Continued)

FOREIGN PATENT DOCUMENTS

EP    1391923 A1    2/2004
JP    2008071831 A    3/2008

OTHER PUBLICATIONS

Italian Search Report and Written Opinion from corresponding Italian Application No. MI2008A1505 dated Sep. 1, 2009.

*Primary Examiner* — Stephen W Smoot
*Assistant Examiner* — Vicki B Booker
(74) *Attorney, Agent, or Firm* — GardereWynne Sewell LLP (57) ABSTRACT

A substrate has a first surface and a second surface opposed to each other. A blind hole is formed in the substrate extending from the first surface at a location for each through via. Each blind hole is filled with a conductive filler; a deepest part of each filler forming a bump portion made of a solder material. Part of the substrate extending from the second surface is removed to have at least the bump portions protrude from the substrate. The non-protruding part of each filler defines the corresponding via and the bump portion defines the corresponding solder bump.

14 Claims, 5 Drawing Sheets

(56) References Cited

U.S. PATENT DOCUMENTS

| | | |
|---|---|---|
| 6,664,129 B2 | 12/2003 | Siniaguine |
| 7,282,444 B2 * | 10/2007 | Tanida et al. ............... 438/667 |
| 2002/0115290 A1 | 8/2002 | Halahan et al. |
| 2004/0043615 A1 | 3/2004 | Yamamoto |
| 2004/0188822 A1 | 9/2004 | Hara |
| 2006/0292877 A1 | 12/2006 | Lake |
| 2007/0228576 A1 | 10/2007 | Trezza |
| 2008/0036082 A1 | 2/2008 | Eun |
| 2009/0160030 A1 | 6/2009 | Tuttle |
| 2009/0243047 A1 | 10/2009 | Wolter et al. |

* cited by examiner

THROUGH VIA STRUCTURE INCLUDING A CONDUCTIVE PORTION AND ALIGNED SOLDER PORTION

CROSS REFERENCE TO RELATED APPLICATIONS

This application is a division of U.S. patent application Ser. No. 12/537,075, filed Aug. 6, 2009, now U.S. Pat. No. 8,759,215, which claims the priority benefit of Italian patent application number MI2008A1505, filed on Aug. 8, 2008, entitled "METHOD FOR FORMING BUMPS IN SUBSTRATES WITH THROUGH VIAS," which is hereby incorporated by reference to the maximum extent allowable by law.

BACKGROUND OF THE INVENTION

1. Field of the Invention

The solution according to an embodiment of the present invention regards the electronic field in general, and in particular it regards bumps for through vias.

2. Discussion of the Related Art

As it is known to those skilled in the electronic field, a through via is a substantially vertical electrical connection that completely crosses the entire thickness of a substrate—such as a silicon wafer or chip. The through vias allow electric signals, as well as supply and reference voltages, to reach deep portions of the chip. In this way, it is possible to exploit the space offered by a chip in an enhanced way, by integrating circuit devices in multiple active layers formed at different depths of the chip, with each active layer that is able to exchange electrical signals with the other ones by means of respective sets of through vias. Furthermore, thanks to the through vias, electric signals provided on a surface of the chip are able to cross the entire thickness of the chip, and reach the opposite surface thereof.

Presently, through vias are widely used for improving the so-called Multi-Chip Modules (MCM).

An MCM is an electronic system implemented on multiple chips—each one integrating a respective electronic circuit—that are arranged in a vertical stack. An MCM typically includes an interposer layer between each pair of adjacent chips of the stack. Said interposer layers are generally crossed by conductive wires having the purpose of electrically connecting pads of the various chips in the stack. However, since the chips are stacked on each other, the routing of the conductive wires crossing the interposer layers becomes very complicated, with a corresponding increase of the parasitic effects.

In order to reduce the negative impact resulting from complicated routing, modern MCMs are now implemented with chips having through vias. In this way, the exchange of electric signals between a pair of adjacent chips in the stack can be carried out by means of conductive paths (the through vias) that cross the higher chip in the pair, without the need of any conductive wire having to exit out of and move around the higher chip in order to reach the lower one.

Particularly, according to a first solution known in the art, the two ends of the through vias of the chips of the pair are provided with corresponding pads made of conductive material, and formed on both surfaces of the chips. In this case, an electric signal generated by an electronic circuit that is integrated on an upper surface of the higher chip can be fed to an electronic circuit integrated on an upper surface of the lower chip by simply wiring a pad formed on the lower surface of the higher chip with a corresponding pad on the upper surface of the lower chip.

Since the routing among the various chips of an MCM implemented in the way described above—i.e., by connecting the pads of the through vias—is definitely simpler compared to that required for an MCM including chips without any through via, the size of the interposer layers can be drastically reduced.

According to a second solution known in the art, it is possible to further compact an MCM by completely removing the interposer layers. Particularly, instead of forming conductive pads on both the ends of each through via, a first end (e.g., the one corresponding to the upper surface of the chip) is left "naked", while the other end (e.g., the one corresponding to the lower surface of the chip) is provided with a solder bump made of conductive material. In this case, the bumps on the lower surface of a chip can be directly soldered to the upper ends of the through vias of the chip underneath. More in detail, after having correctly positioned the two chips in such a way to align the bumps on a surface of one chip to the ends of the through vias on the facing surface of the other chip, heat is provided to melt the solder material forming the bumps, so as to create a solid bond between the two chips.

However, none of the two solutions described above allows taking full advantage of the size miniaturization offered by the modern technologies for manufacturing integrated circuits. Indeed, even if modern technologies now allow obtaining through vias having very low diameters, the size of the pads and bumps that may be formed over the end of a through via cannot be miniaturized to the same extent. For example, as it is described in the document "Si Through-Hole Interconnections Filled With Au—Sn Solder by Molten Metal Suction Method" by Satoshi Yamamoto, Kazuhisa Itoi, Tatsuo Suemasu and Takashi Takizawa, Electron Device Laboratory, Fujikura Ltd., through vias may be generated by forming blind holes extending in the chip from a first surface thereof, filling said blind holes with conductive material according to the known Molten Metal Suction Method (MMSM), and then removing portions of the chip starting from the opposite surface of the chip until the conductive material is exposed. This solution allows obtaining through vias with diameters lower than 30 µm. However, the typical diameter of a bump obtainable with the current technologies is much larger, typically of the order of 100 µm, with potential scaling capability of 40/50 µm in the following future. From these values it is clear that the number of electrical interconnections available on the surface of a chip for an MCM is strongly limited by the non-negligible size of the bumps. This is a serious problem, since a modern electronic system implemented on a MCM may require a number of electrical interconnections equal to 10,000-15,000. Using the solutions already known in the art, implementing an electronic system on an MCM with said high number of electrical interconnections requires the use of chips having wide surfaces, going against the trend of having electronic devices miniaturized as much as possible.

Another important problem to be considered regards the routing of electronic systems for digital applications to be implemented by means of MCMs. Generally, it is possible to functionally divide a generic electronic system for digital applications in two main functional units, which have to communicate to each other: a processing unit, adapted to process data, and a memory unit, adapted to store the data to be processed by the processing unit. Thus, in an MCM for digital applications, the processing unit is implemented by means of a dedicated chip integrating a microprocessor (base-band chip), while the memory unit is advantageously implemented by means of a set of chips each one dedicated to integrate a respective memory circuit; for example, one or more chips may integrate respective RAMs, further one or more chips may integrate respective ROMs or flash memories, and so on.

Naturally, an MCM made of a stack of memory chips together with the baseband chip suffers from the abovementioned drawbacks as well due to the non-negligible sizes of the bump obtainable with the actual technologies. Moreover, a MCM for digital applications generally suffers from additional routing drawbacks, mainly given by the great variety and diversity of the chips that are stacked in a same MCM. Indeed, the number of electrical interconnections of the memory chips is in general very different from that of the baseband chip; moreover, the various memory chips are generally different from each other, and have generally very different sizes. Therefore, using the approaches known in the art, it is really difficult to implement an electronic system by means of an MCM having a compact size.

In view of the state of the art outlined in the foregoing, the Applicant has faced the problem of how to improve the known solutions for manufacturing bumps for through vias.

SUMMARY OF THE INVENTION

According to an embodiment of the present invention there is provided a method for manufacturing solder bumps for through vias in a substrate having a first surface and a second surface opposed to each other. The method includes the steps of forming a blind hole extending in the substrate from the first surface for each via and filling each blind hole with a conductive filler; a deepest part of each filler includes a bump portion made of a solder material. The method further includes the step of removing a part of the substrate extending from the second surface to have at least the bump portions protrude from the substrate. The non-protruding part of each filler defines the corresponding via and the bump portion defines the corresponding bump.

According to another embodiment of the present invention there is provided an electronic device comprising a substrate and a set of solder bumps being manufactured with this method.

According to another embodiment of the present invention there is provided an electronic module including a plurality of these devices.

BRIEF DESCRIPTION OF THE DRAWINGS

The invention itself, as well as further features and advantages thereof will be best understood by reference to the following detailed description, given purely by way of a non-restrictive indication, to be read in conjunction with the accompanying drawings. In this respect, it is expressly intended that the figures are not necessarily drawn to scale and that, unless otherwise indicated, they are merely intended to conceptually illustrate the structures and procedures described herein. Particularly.

DETAILED DESCRIPTION

Referring to FIGS. 1 through 9, a method for manufacturing solder bumps for through vias in a substrate according to a first embodiment of the present invention is described. In particular, the drawings are cross-sectional views of the substrate that detail various steps of the method for the generation of a through via and the solder bump associated thereto.

Figure 1:
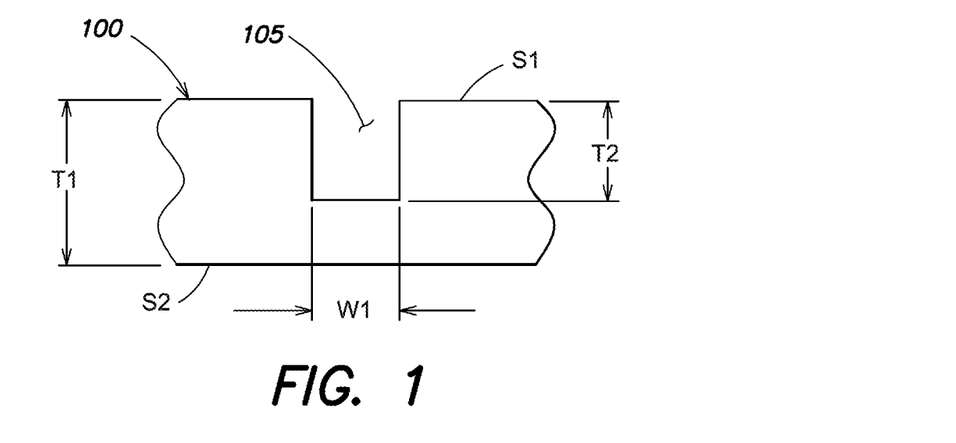
FIG. 1-9 illustrate steps of a method for manufacturing solder bumps for through vias in a substrate according to an embodiment of the present invention.

Considering in particular FIG. 1, the starting material is a semiconductor substrate 100, e.g., a silicon substrate, from now on referred to with the simpler term of chip.

The chip 100, having a thickness T1, for example ranging from 200 µm to 300 µm, comprises two main planar surfaces opposed to each other, namely an upper surface S1 and a lower surface S2. The first step of the method comprises selectively forming a blind hole 105 extending in the chip 100 from the upper surface S1. The blind hole 105 may be generated using one among the methods already known in the art, e.g., by means of a Deep Reactive Ion Etching (DRIE) process or using a laser-based process. The blind hole 105 is formed with a depth T2—lower than the thickness T1 of the chip 100—and a width (diameter) W1; the values of the depth T2 and of the width W1 depend on the desired size of the through via that has to be manufactured. For example, the depth T2 of the blind hole 105 may be of the order of 70-80 µm, while the width W1 thereof may be of the order of 5-50 µm.

Figure 2:
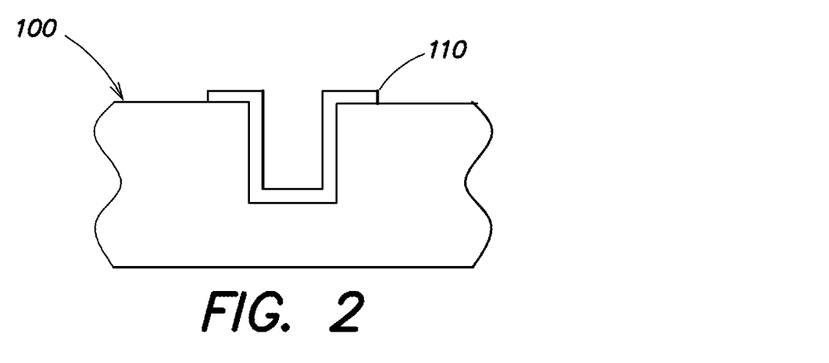

The following step is illustrated in FIG. 2, wherein an internal insulating layer—identified in the figure with the reference 110—is formed on an internal surface of the blind hole 105. For example, an SiO2 film, an SiN film or the like is formed by use of thermal oxidation or Chemical Vapor Deposition (CVD). The thickness of the internal insulating layer 110 may be, for example, of the order of 1 µm. The purpose of said internal insulating layer 110 is to electrically insulate the through via to be formed from the rest of the chip 100.

Figure 3:
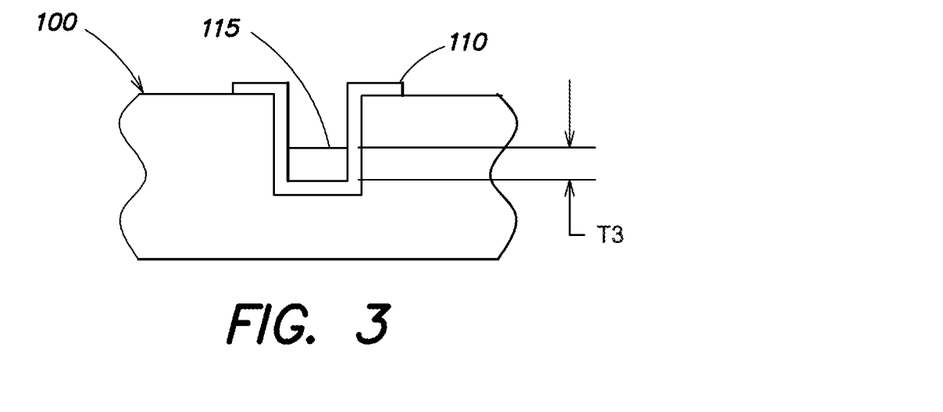

In the step illustrated in FIG. 3, the deepest portion of the blind hole 105 is filled by a portion of solder material. As will be more clear in the following portions of the present description, said portion of solder material—identified in the figure with the reference 115 and from now on referred to with the term of bump portion—will define the solder bump associated with the through via to be formed. For this reason, the thickness T3 of the bump portion 115 will also define the thickness of the resulting solder bump; for example, the thickness T3 may be of the order of 5-10 µm. The solder material forming the bump portion 115 may be a tin-based metallic alloy (for example, TiN or Silver Copper:SAC), or any other conductive material adapted to be used for conductive soldering operations and having a relative low melting temperature. The filling operations of the blind hole 105 with the bump portion 115 may be advantageously carried out using the MMSM.

Figure 4:
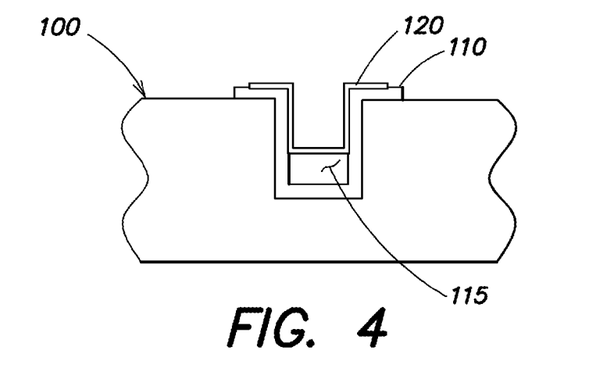

The next step is illustrated in FIG. 4, wherein a film of barrier metal—identified in the figure with the reference 120—is deposed on the surfaces of the blind hole 105 covered by the internal insulating layer 110 and on the bump portion 115. As it is well known to those skilled in the electronic, a barrier metal, such as Co, Ru or TiN, is used to prevent diffusion of conductive materials, allowing at the same time to maintain a good electronic contact.

Figure 5:
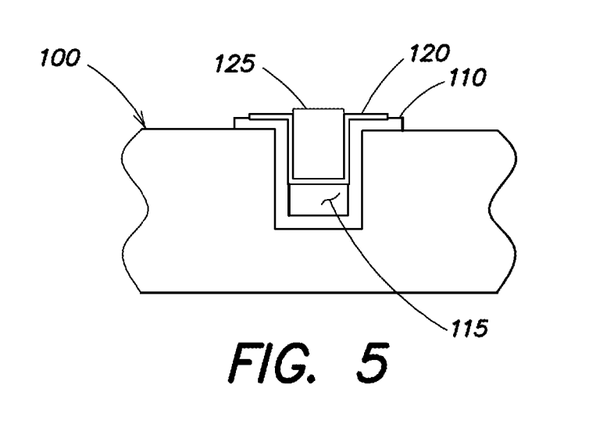

In FIG. 5, after the deposition of the film of barrier metal 120, the portion of the blind hole 105 left empty is completely filled with a conductive material, forming a conductive portion—identified in the figure with the reference 125. For example, the conductive material may be Cu or any other conductive material having a melting temperature higher than that of the solder material; for example, the conductive material may be deposed into the blind hole 105 by means of an electroplating process.

At this step, the blind hole 105 results to be completely filled by a filler, having a lower portion (of thickness T3) formed by the bump portion 115 that will define the solder bump and an upper portion (of thickness T2-T3) formed by the conductive portion 125 that will define the through via. As previously mentioned, the film of barrier metal avoids having the conductive portion 125 diffuse into the surrounding materials, allowing at the same time maintaining a good electronic contact with the bump portion 115.

Figure 6:
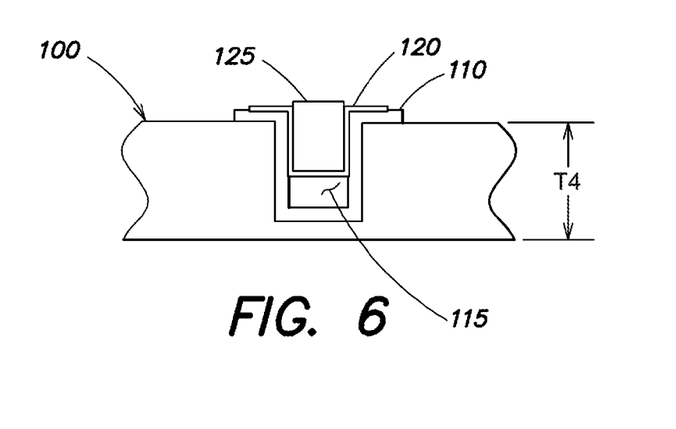
Figure 7:
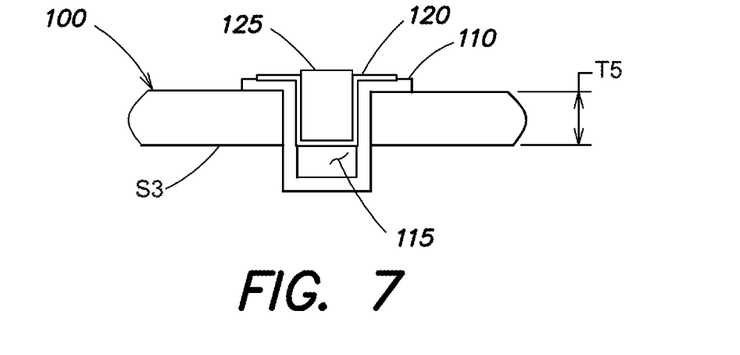

In the FIGS. 6 and 7, the chip 100 is subjected to operations directed to reduce the thickness T1 of the chip 100, to have the bump portion 115 (covered with the internal insulating layer 120) to protrude from the chip 100. Particularly, the lower surface S2 is firstly subjected to conventional (coarse) back-grinding operations, for reducing the thickness of the chip 100 to an intermediate thickness T4, for example ranging from 90 μm to 100 μm (see FIG. 6). Then, through an etching solution, for example HF or $HNO_3$, the lower portion of the chip 100 is selectively etched in an accurate way, for example by means of a spin-etching process, in such a way to expose the bump portion 115 coated with the internal insulating layer 110. After the etching process, a new lower surface of the chip 100—identified in FIG. 7 with the reference S3—is defined, with the chip 100 that reaches a final thickness T5, for example ranging from 70 μm to 80 μm.

At this point the through via is completely formed, comprising in particular the conductive portion 125—coated with the internal insulating layer 110 and the film of barrier metal 120A—that is embedded in the chip 100.

The remaining steps of the method are instead directed to operations to be performed on the protruding bump portion 115 to form the solder bump associated with the through via.

Figure 8:
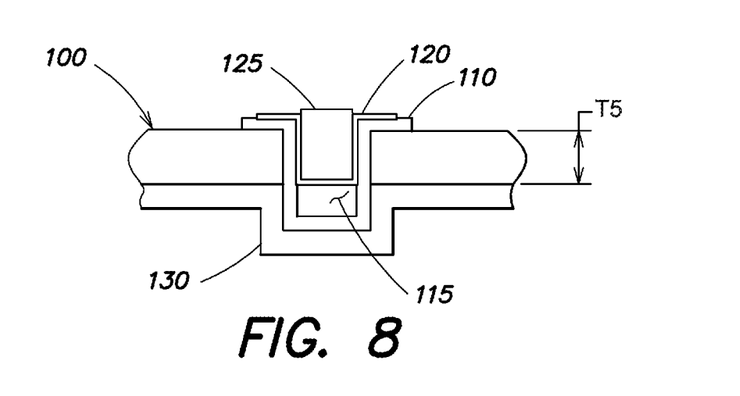

Particularly, in the step illustrated in FIG. 8, an external insulating layer—identified in the figure with the reference 130—is formed on the bottom of the chip 100 to cover the lower surface S3 and the internal insulating layer 110 covering the protruding bump portion 115.

Figure 9:
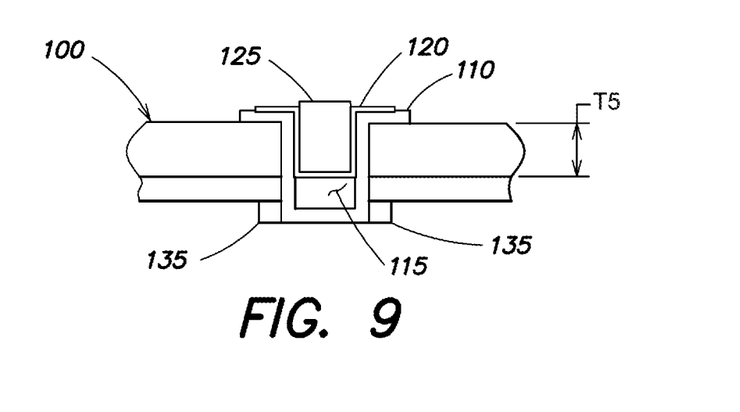

The last step is illustrated in FIG. 9, wherein the chip 100 is subjected to an anisotropic etching process directed to expose the solder material of the protruding bump portion 115 to define the solder bump. Particularly, the external insulating layer 130 and the portions of the internal insulating layer 110 covering the protruding bump portion 115 are etched until exposing the lower surface S3 and the protruding bump portion 115; residual portions of the external insulating layer 130 are left around the protruding bump portion 115 to define an insulating spacer 135 having the purpose of maintaining the bump portion 115 insulated from the rest of the chip 100, i.e., its lower surface S3.

Thus, at the end of the step illustrated in FIG. 9, the chip 100 is provided with a through via—defined by the conductive portion 125 embedded in the chip—with a solder bump—defined by the exposed and protruding bump portion 115—associated with an end of the through via.

In principle, the method according to an embodiment of the present invention comprising creating bumps during the process directed to manufacture the through vias. Said bumps are generated together with the through vias by forming blind holes in the chip, partially filling said holes with solder material, finishing to fill the holes with conductive material and then removing portions of the chip to expose the solder material.

Thanks to this solution it is possible to manufacture solder bumps having the same size (in particular, the same diameter) of that of the through vias. In this way, it is possible to exploit at best the surfaces of the chip, forming a high number of through vias in the same chip without occurring in the drawbacks described in the introduction of the present description.

Making reference to the exemplary values used in the description with reference to the FIG. 1-9, with the proposed solution it is possible to produce solder bumps having diameters of the order of 5 μm.

Moreover, the proposed method does not require the use of dedicated and expensive processing tools and machineries, since the solder bumps are generated using the same instrumentations already available for manufacturing the through vias. Indeed, with the proposed solution it is possible to produce solder bumps having the same diameter of the through vias without having to introduce additional complex manufacturing steps.

Another advantage of the present solution comprises in the fact that the solder bumps manufactured according to the proposed method result automatically aligned with the associated through vias. This is a great benefit, since with the solutions already known in the art, the solder bumps need to be formed on the ends of the through vias after the generation thereof, and thus they require to be carefully aligned with the through vias.

In the following of the present description an electronic system implemented in the form of a MCM will be described according to an embodiment of the present invention.

Figure 10:
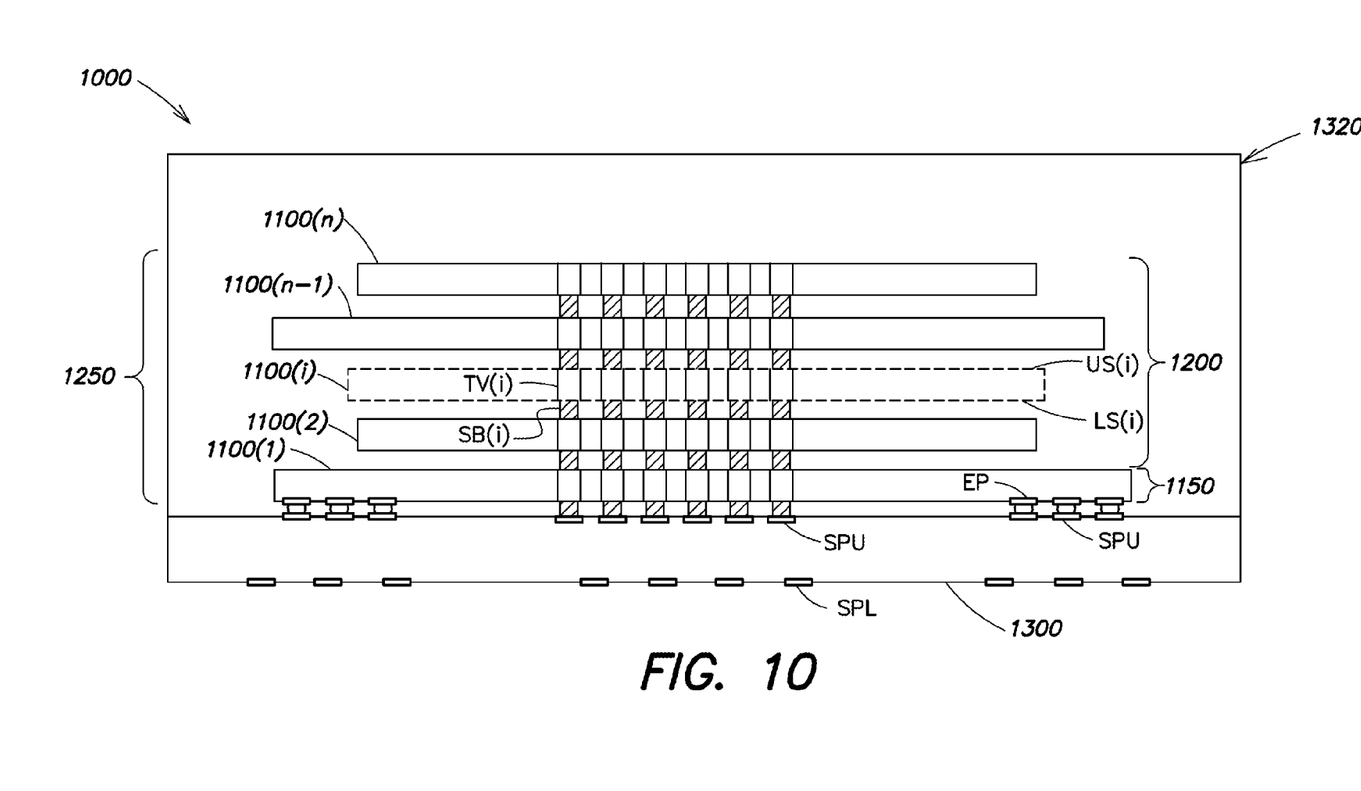
FIG. 10 illustrates a sectional view of an electronic system implemented in the form of a MCM according to an embodiment of the present invention.

Particularly, in FIG. 10 a sectional view of an electronic system implemented in the form of a MCM, globally identified as 1000, is illustrated; the MCM 1000 includes a plurality of electronic circuits each one integrated in a respective chip 1100(i) (i=1 to n).

According to this embodiment of the invention, the MCM 1000 is suitable for digital applications, and comprises two main functional units interacting with each other, i.e., a processing unit 1150 and a memory unit 1200. The processing unit 1150 includes a single chip 1100(1) (hereinafter referred to as "baseband chip") that integrates a processor (not shown in the figure) adapted to process data. Moreover, the baseband chip 1100(1) is also adapted to exchange signals with the outside of the MCM 1000. The memory unit 1200 includes a plurality of chips 1100(2)-1100(n) (hereinafter referred to as "memory chips") each one integrating a respective memory circuit (not shown in the figure) adapted to store the data to be processed by the processor unit.

The chips 1100(1)-1100(n) are vertically stacked on each other in such a way to form a stack 1250, with the baseband chip 1100(1) at the bottom and the memory chip 1100(n) at the top of the stack 1250. Preferably, the stack 1250 is installed on a suitable chip carrier, for example a multi-layer substrate 1300 like those normally used for the packaging of the Ball Grid Array (BGA) devices, i.e., including several layers formed by different materials, like plastics or ceramics.

In order to improve the structural stability of the MCM 1000, the chips 1100(i) are also enclosed in a protective molding 1320, e.g., made of proper resins.

Each chip 1100(i) includes a respective lower main surface LS(i) facing toward the substrate 1300, and an upper main surface US(i) opposed to the lower main surface LS(i).

The baseband chip 1100(1) includes a set of external contacting pads EP on the lower surface LS(1) for exchanging electrical signals with the outside of the MCM 1000—through the substrate 1300, as will be described in the following—in such a way to allow the MCM 1000 to communicate with external peripherals. In particular, the external contacting pads EP are adapted to exchange, with the outside of the MCM 1000, dedicated signals for the microprocessor integrated in the baseband chip 1100(1), necessary for the operation thereof.

Each chip 1100(*i*) included in the MCM 1000 is provided with a respective set of through vias TV(i) allowing the passage of electrical signals from its lower surface LS(i) to its upper surface US(i) and vice versa. Each through via TV(i) ends with a corresponding solder bump SB(i) formed on the lower surface LS(i) of the chip 1100(*i*) embedding the through via TV(i). As will be described in detail in the following of the present description, the through vias TV(i) of the various chips 1100(*i*) in the stack 1250 allow the baseband chip 1100(1) to exchange signals with the memory chips 1100(2)-1100(*n*).

The through vias TV(i) and the corresponding solder bumps SB(i) are made using the method previously described with reference to FIGS. 1-9, with each through via TV(i) and solder bump that may have, e.g., a diameter of about 5 μm.

The through vias TV(i) are arranged in such a way that each solder bump SB(i) on the lower surface LS(i) of a chip 1100(*i*) is aligned with the end of a corresponding through via TV(i−1) on the upper surface US(i−1) of the preceding chip 1100(*i*−1) in the stack 1250. In this way, by directly soldering the solder bumps SB(i) of the chip 1100(*i*) to the ends of corresponding through vias TV(i−1) on the upper surface US(i−1) of the chip 1100(*i*−1), the two adjacent chips 1100(*i*), 1100(*i*−1) are able to exchange electric signals.

Moreover, since the electrical signals may travel from the lower surface LS(i) of a chip 1100(*i*) to its upper surface US(i) and vice versa, an electric signal output by a through via TV(1) of the baseband chip 1100(1) is able to reach a corresponding through via TV(i) of a generic memory chip 1100(*i*) of the stack 1250 following a (vertical) conductive path that crosses the chips 1100(2)-1100(*i*−1) preceding said memory chip 1100(*i*) in the stack 1250, and in particular by means of the respective trough vias TV(2)-TV (i−1). The same conductive path may also be used in the opposite direction, i.e., it may be used by said generic memory chip 1100(*i*) for providing electric signals to said through via TV(1) of the baseband chip 1100(1).

Therefore, according to the proposed solution, the conductive paths that allow the various chips 1100(*i*) in the stack 1250 to exchange signals are made by series of aligned vias (interconnected to each other by means of respective solder bumps).

Naturally, in order to guarantee such alignment, both the baseband chip 1100(1) and the memory chips 1100(2)-1100(*n*−1) need to have the through vias TV(i) in the same positions.

In this way, it is not necessary to provide interposer layers between each pair of adjacent chips 1100(*i*). With the proposed arrangement, the various chips 1100(*i*) of the stack 1250 are able to exchange signals to each other without the need of complicated routing structures, the presence of the solder bumps being sufficient.

In order to exchange signals with the outside of the MCM 1000, both the external contacting pads EP and the solder bumps SB(1) associated with the through vias TV(1) of the baseband chip 1100(1) are connected with respective interface pads SPU on an upper surface of the substrate 1300. Particularly, the external contacting pads EP are connected with the interface pads SPU by means of dedicated electrical interconnections EC(1)—for example, balls of solder—, while the solder bumps SB(1) associated with the through vias TV(1) are directly soldered on the interface pads SPU. Said interface pads SPU are then electrically connected with I/O substrate pads SPL on a lower surface of the substrate 1300, by means of corresponding electrical links, whose structure depends on how the substrate 1300 is arranged (e.g., by means of conductive tracks).

According to the proposed solution, it is possible to easily accommodate (in the MCM 1000) memory chips 1100(*i*) having really different sizes, since the sizes of said memory chips do not influence the positions of the through vias TV(i).

According to an embodiment of the present invention, each set of through vias TV(i) is arranged on a central portion of the chip 1100(*i*). For example, the through vias TV(i) of each set can be arranged according to a squared array, as illustrated in the FIG. 11A-11B. Particularly, a top plan view of the lower main surface LS(1) of the baseband chip 1100(1) is illustrated in greater detail in FIG. 11A, while a top plan view of view of the lower main surface LS(i) of a generic memory chip 1100(*i*) is illustrated in greater detail in FIG. 11B.

Figure 11A:
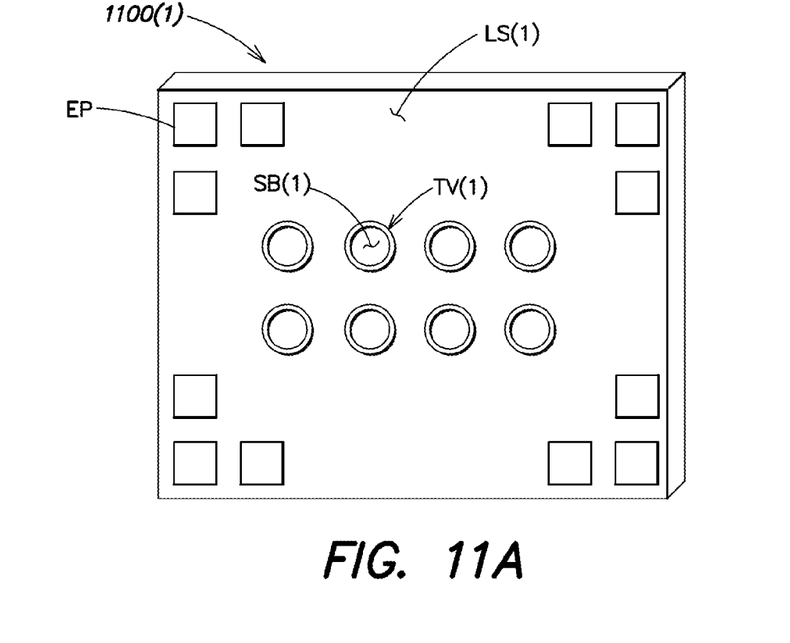
FIG. 11A illustrates a lower main surface of a baseband chip included in the MCM of FIG. 10 in greater detail.
Figure 11B:
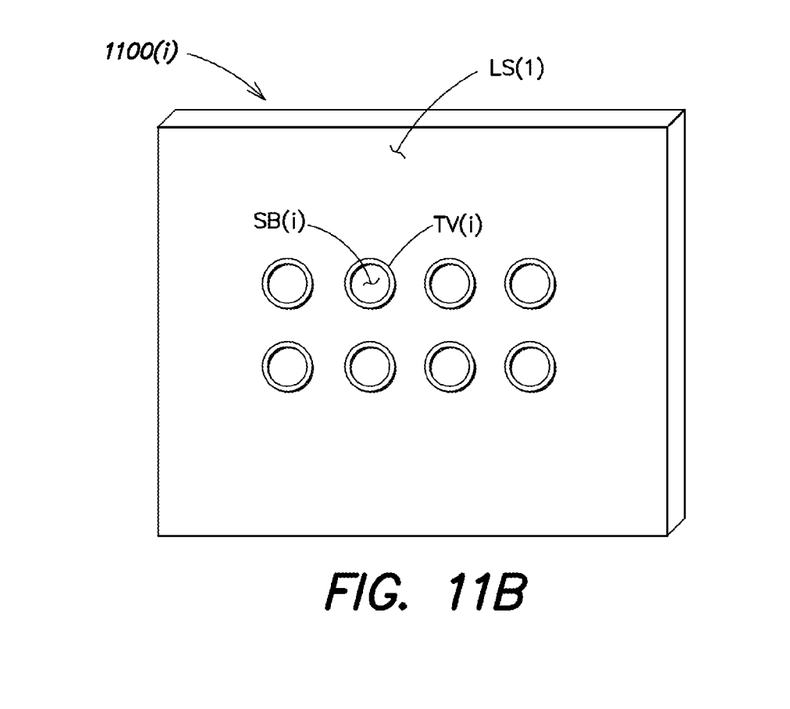
FIG. 11B illustrates a lower main surface of a memory chip included in the MCM of FIG. 10 in greater detail.

Moreover, according to an embodiment of the present invention, the external contacting pads EP are arranged on a peripheral portion of the lower main surface LS(1) of the baseband chip, in such a way not to interfere with the (vertical) conductive paths defined by the through vias TV(i) of the stacked chips 1100(*i*).

The present invention has been described making reference to some exemplary embodiments. Naturally, in order to satisfy contingent and specific requirements, a person skilled in the art may apply to the solution described above many modifications and alterations. It should be understood that various omissions, substitutions and changes in the form and details of the described embodiments, as well as other embodiments are possible; moreover, it is expressly intended that specific elements and/or method steps described in connection with any disclosed embodiment of the invention may be incorporated in any other embodiment as a general matter of design choice.

For example, the proposed solution may be implemented with an equivalent method (using similar steps, removing non essential steps or adding optional steps).

Even if in the present description reference has been made to a substrate made of silicon, similar considerations apply if the proposed method is used for forming through vias and solder bumps in substrates made of different materials.

Nothing prevents from exposing the bump portions from the substrate in a different way, e.g., with a single etching operation, and by a different amount, e.g., together with a portion of the conductive material of each conductive filler.

Similar considerations apply if the through vias and/or the solder bumps have different shapes and sizes, and/or are made of different materials.

The concepts of the present invention are also applicable in case the step of covering the internal surface of the blind hole with the dielectric layer before filling the blind hole is not performed. However, in this case the substrate has to be made of a non-conductive material, like ceramic, that does not require to be electrically insulated from the through via that embeds.

Similar considerations apply in case the insulating spacers around the protruding bump portions are not formed.

Even if less advantageous, the concepts of the present invention can be also applied in case the conductive material is deposed in the blind hole directly on the bump portion, without any barrier metal.

Even if in the present description reference has been made to a MMSM method, nothing prevents from filling the blind holes with the solder material in a different way.

Similar considerations apply for the step of completing the filling with the conductive material, which can be performed in a different way.

Naturally, even if in the present description reference has been made to a method for forming through vias and solder bumps in a substrate adapted to be used in an MCM, the concepts of the present invention are also applicable to substrates adapted to be used individually, e.g., directly soldered according to a flip chip interconnection method to a printed card board.

Although in the present description reference has been made in particular to electronic systems for digital applications, similar considerations apply if the chips stacked on the baseband chip are auxiliary chips that do not necessarily include memory circuits, and/or if the baseband chip includes a circuit different from a microprocessor.

The proposed MCM may also be implemented with the electronic devices provided with standard pads; in this case, the pads of adjacent electronic devices in the stack may be electrically interconnected by means of wires or standard solder bumps.

Nothing prevents from overturning the stack, and stacking the memory chips under the baseband chip; in this case, the baseband chip will be accessed from the outside by means of the external connecting pads on the upper surface thereof.

Even if less advantageous, the concepts of the present application may be applied in case the through vias are located in a position different from the central portion of the chips; for example, the through vias may be positioned within a same edge portion of each semiconductor chip.

Similar considerations apply for the position of the external connecting pads, which can be arranged in zones of the baseband chip that are different from the peripheral portion thereof; in any case, the location of said external connecting pads should not interfere with the conductive paths defined by the through vias of the stacked semiconductor chips.

For example, an alternative way of implementing the proposed solution provides for arranging the through vias on the semiconductor chips according to an array different from the squared one illustrated in the figure.

Similar considerations apply if the number of through vias of each memory chip is different. However, in order to allow each through via of each memory chip in the stack to be reached by a through via of the baseband chip, the number of through vias of each memory chip should be not higher than the number of through vias of the preceding memory chip in the stack.

The proposed MCM may be used in any complex system (such as a computer).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electronic device comprising a substrate, a set of through vias crossing the substrate, and a set of solder bumps, each solder bump connected to a corresponding via, comprising:
    a lined hole extending in the substrate from the first surface for each via;
    each lined hole having a conductive liner on walls of the lined hole with the lined hole being filled with a conductive filler, wherein the conductive filler comprises a first metal material in an upper portion of each lined hole extending above said first surface and having a first melting point and second metal material in a lower portion of each lined hole extending below the second surface and having a second melting point lower than the first melting point, and wherein the second metal material is a solder material; and
    an insulating layer on the second surface of the substrate and surrounding the second metal material;
    wherein the first metal material defines the corresponding via and the second metal material defines the solder bump connected to the corresponding via.

2. An electronic module including a plurality of electronic devices according to claim 1, wherein:
    the electronic devices are arranged in an ordered stack extending along a stacking direction, the solder bump of each via of each electronic device being connected to a corresponding via of a preceding electronic device in the ordered stack, the connected vias being aligned along the stacking direction.

3. The electronic module of claim 2, wherein the through vias of each electronic device are arranged in a central portion of the electronic device.

4. The electronic module of claim 3, wherein the plurality of electronic devices includes a main electronic device and a set of auxiliary electronic devices, the main electronic device including a set of external pads for exchanging electrical signals with the outside of the module, the external pads being arranged in a peripheral portion of the main electronic device.

5. An electronic device, comprising:
    a semiconductor substrate having a top surface and an opposed bottom surface;
    an opening extending through the semiconductor substrate from the top surface to the bottom surface;
    an insulating liner on a sidewall of said opening forming an insulation lined opening;
    in a lower portion of said insulation lined opening, a solder material which only partially fills said insulation lined opening, said solder material having a top surface and further having a bottom surface which extends below the bottom surface of the semiconductor substrate;
    a conductive material liner on a sidewall of said insulating liner and on the top surface of the solder material forming a conductive lined opening; and
    a conductive material having a melting point higher than the solder material which fills the conductive lined opening, said conductive material having an upper surface which extends above the top surface of the semiconductor substrate.

6. The device of claim 5, wherein the insulating liner extends on the top surface of the semiconductor substrate around the conductive material.

7. The device of claim 5, wherein the conductive liner extends on the top surface of the insulating liner around the conductive material.

8. The device of claim 5, further comprising an insulating layer on the bottom surface of the semiconductor substrate and including an opening through which the solder material extends.

9. The device of claim 8, wherein the insulating liner also extends through the opening in the insulating layer on the bottom surface.

10. The device of claim 9, further comprising an insulating spacer formed of the insulating layer, wherein the insulating spacer surrounds the solder material.

11. The device of claim 10, wherein the insulating spacer has a bottom surface which extends below a bottom surface of the solder material.

12. The device of claim 10, wherein the insulating spacer has a bottom surface substantially coplanar with a bottom surface of the insulating liner.

13. The device of claim 5, wherein the conductive material having the melting point higher than the solder material which fills the conductive lined opening is copper.

14. The device of claim 5, wherein the conductive material which fills the conductive lined opening defines a conductive via through the semiconductor substrate and the solder material defines a solder bump for said conductive via.

\* \* \* \* \*